United States Patent
Kitazume et al.

(10) Patent No.: US 8,222,808 B2
(45) Date of Patent: Jul. 17, 2012

(54) ORGANIC ELECTROLUMINESCENCE ELEMENT AND METHOD FOR MANUFACTURING THE SAME

(75) Inventors: Eiichi Kitazume, Tokyo (JP); Ryo Shoda, Tokyo (JP)

(73) Assignee: Toppan Printing Co., Ltd. (JP)

( * ) Notice: Subject to any disclaimer, the term of this patent is extended or adjusted under 35 U.S.C. 154(b) by 134 days.

(21) Appl. No.: 12/793,592

(22) Filed: Jun. 3, 2010

(65) Prior Publication Data

US 2010/0308717 A1    Dec. 9, 2010

(30) Foreign Application Priority Data

Jun. 9, 2009    (JP) ................. 2009-138026

(51) Int. Cl.
*H01L 51/00*    (2006.01)
(52) U.S. Cl. .......................... 313/504; 445/24
(58) Field of Classification Search .......... 313/504, 313/506; 445/24
See application file for complete search history.

(56) References Cited

U.S. PATENT DOCUMENTS

| | | | |
|---|---|---|---|
| 2005/0093432 A1* | 5/2005 | Yamazaki et al. | 313/503 |
| 2007/0018150 A1* | 1/2007 | Nakajima et al. | 257/10 |
| 2009/0058268 A1* | 3/2009 | Yoshida et al. | 313/504 |
| 2009/0163108 A1* | 6/2009 | Nakajima et al. | 445/24 |
| 2010/0079064 A1* | 4/2010 | Kimura et al. | 313/504 |

FOREIGN PATENT DOCUMENTS

| | | |
|---|---|---|
| JP | 05-234681 | 9/1993 |
| JP | 08-048858 | 2/1996 |
| JP | 09-063771 | 3/1997 |
| JP | 2001-093668 | 4/2001 |
| JP | 2001-155858 | 6/2001 |

\* cited by examiner

*Primary Examiner* — Karabi Guharay
(74) *Attorney, Agent, or Firm* — Squire Sanders (US) LLP (57) ABSTRACT

In accordance with an aspect of the present invention, an organic electroluminescence element includes a first electrode on a substrate, a second electrode which faces the first electrode, a luminescent medium layer which is between the first electrode and the second electrode and includes an organic luminescent layer and a carrier injection layer between the first electrode and the organic luminescent layer, a first carrier injection layer formed on the first electrode, a partition wall formed so as to section the first electrode and cover a part of the first carrier injection layer, and a second carrier injection layer formed on the partition wall and the first carrier injection layer which is not covered by the partition wall.

11 Claims, 5 Drawing Sheets

ORGANIC ELECTROLUMINESCENCE ELEMENT AND METHOD FOR MANUFACTURING THE SAME

CROSS REFERENCE TO RELATED APPLICATION

This application is based on and claims the benefit of priority from the Japanese Patent Application number 2009-138026, filed on Jun. 9, 2009; the entire contents of which are incorporated herein by reference.

BACKGROUND OF THE INVENTION

Field of the Invention

The present invention relates to an organic electroluminescence element and an image display unit in which the organic electroluminescence element is employed.

An organic electroluminescence element (hereinafter referred to as an organic EL element) emits light by applying a voltage to an organic luminescent layer of an organic luminescence material formed between electrodes facing each other. In order to efficiently manufacture a reliable organic EL element, a thickness of the organic luminescent layer is important. In addition, when the organic luminescent layer is used for a color display, patterning with a high definition is necessary.

Generally, a substrate having pattered photo-sensitive polyimide formed as a partition wall which sections sub pixels is used for a substrate for a display. In this case, a pattern of the partition wall is formed so as to cover an edge part of a transparent electrode formed as an anode.

There are two kinds of methods for forming a hole injection layer which injects a hole carrier, that is, a dry film-formation method and a wet film-formation method. When a wet film-formation method is employed, a polythiophen derivative scattered in water is generally used. However, it is difficult to uniformly form the hole injection layer because an aquatic ink is easily influenced by an under-layer. On the other hand, by employing a deposition method, an ink can be easily and uniformly coated on an entire surface.

There are also two kinds of methods for forming an organic luminescent layer, that is a dry film-formation method and a wet film-formation method. When a vacuum deposition method of the dry film-formation method by which a uniform film can be easily formed is employed, patterning with a mask having a fine pattern is required. Hence, it is very difficult to form a fine pattern and a substrate having a large size.

Consequently, there have been attempts recently to form a coating liquid by dissolving a high molecular material in a solvent, and to form a thin film of the coating liquid by a wet film-formation method. A layer structure, in the case where a luminescent medium layer including an organic luminescent layer is formed by a wet film-formation method using a coating liquid of a high molecular material, is generally a double-layered structure in which a hole transport layer and an organic luminescent layer are stacked from an anode side. In this case, in order to manufacture a color panel, the organic luminescent layer can be separately coated using organic luminous inks in which organic luminescence materials having a red color (R), a green color (G) and a blue color (B) are respectively dissolved or stably dispersed in a solvent. (Refer to Patent Documents 1 and 2)

A carrier injection layer (also referred to as a carrier transport layer) can be formed between electrodes other than an organic luminescent layer. The carrier injection layer is used for controlling an amount of an injected electron, when an electron is injected into the organic luminescent layer from one electrode, or controlling an amount of an injected hole, when a hole is injected from the other electrode into the organic luminescent layer, and refers to a layer arranged between one electrode and the organic luminescent layer. For an electron injection layer, for example, an organic material having an electron transporting property such as a metal complex of a quinolinol derivative, or alkali metal such as Ca and Ba which have a relatively low work function can be used, or a plurality of layers having these functions may be stacked as an electron injection layer. As a material for a hole injection layer, TPD (a triphenyleneamine derivative: refer to Patent Document 3), PEDOT:PSS (a mixture of polythiophene and polystyrene sulfonic acid: refer to Patent Document 4) and a hole transport material of an inorganic material (Refer to Patent Document 5) are well-known. In whichever case, the electron injection layer and/or the hole injection layer can be formed between an electrode and an luminescent layer in order to improve luminescent efficiency, since the electron injection layer and the hole injection layer control an amount of an injected electron/hole.

Ideally, it becomes possible to elicit performance from an organic EL element by employing a different carrier layer for each luminescent layer having each luminescent color of RGB. However, since the number of steps in the manufacturing process is increased and patterning with a high definition is difficult, the carrier transport layer is generally formed as a uniform and common film among the luminescent layers having RGB.

Figure 5:
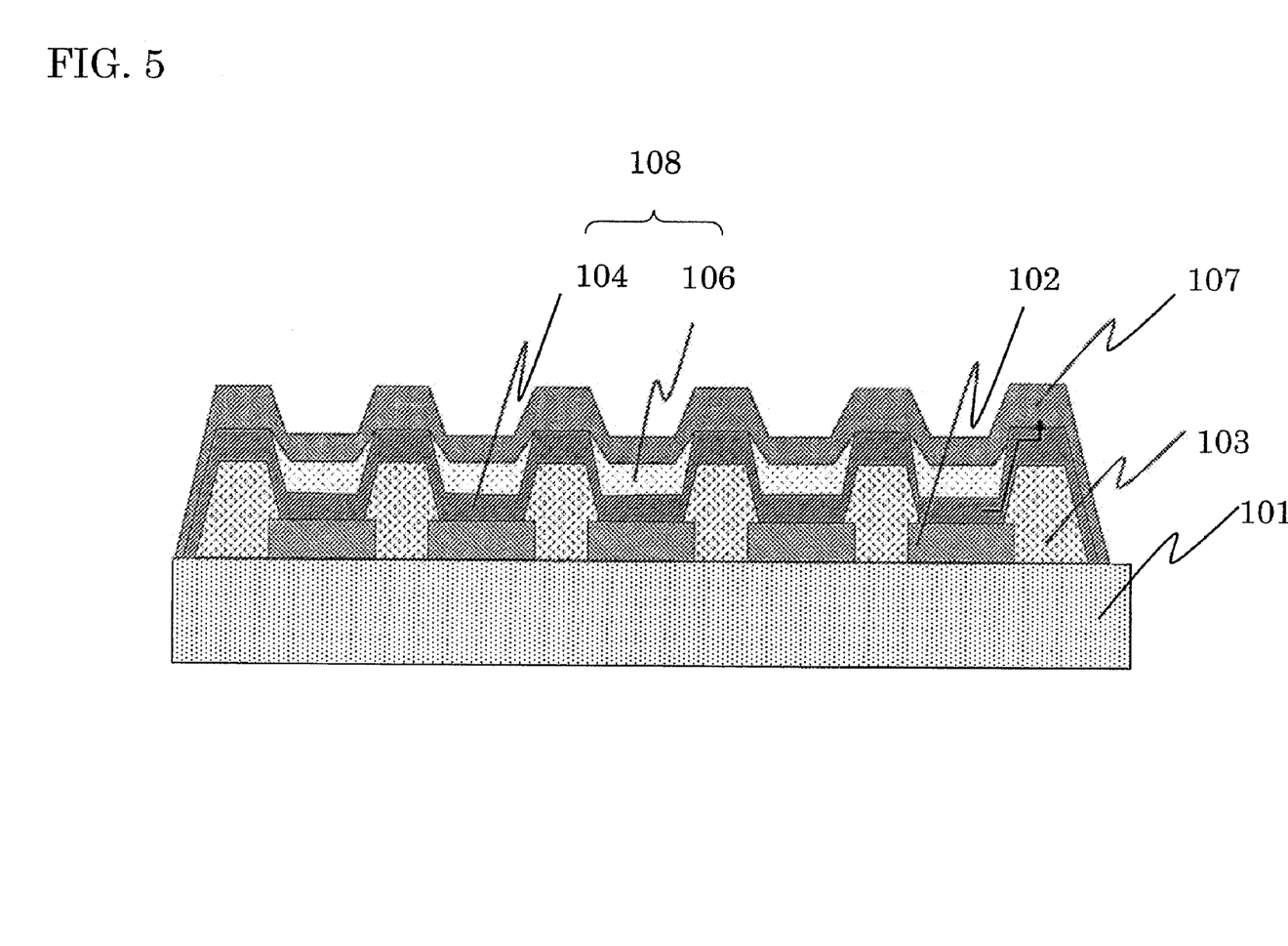
FIG. 5 is an explanatory cross-sectional diagram of a traditional organic EL element.

FIG. 5 is a view showing a structure of a traditional organic EL element. A first electrode 102 is formed on a substrate 101, and a hole injection layer 104, an organic luminescent layer 106 and a second electrode 107 are stacked on the first electrode. In addition, a partition wall 103 which sections pixels (sub pixels) is also arranged. When a hole injection layer for injecting a hole carrier is arranged on the entire surface of a luminescent area and the partition wall on the substrate where sub pixels are sectioned, leak current which flows into a non-luminescent area of pixels in an in-plane direction of the film of the hole injection layer flows into a counter electrode on the partition wall, as indicated by an arrow in the film of the hole injection layer on the partition wall. Hence, luminescence intensity is reduced because a predetermined electric current does not flow into the luminescent area of the pixels.

As a solution to the above, resistance in an in-plane direction may be heightened by forming the film of a carrier injection layer arranged on the entire surface of the organic EL element more thinly. However, when an ultra-thin film is used, short defects between an electrode and a counter electrode may easily occur, because the ultra-thin film does not efficiently cover an asperity caused by micro-projections and dirt of the film surface of the electrode that is an under-layer of the ultra-thin film, which did not previously occur as a problem. A transparent electrode which is used for the electrode tends to have a multi-crystal structure in general in order to have a low-value resistance. Then, the thinner the thickness of the film of the transparent electrode becomes, the more easily short defects may occur, because the transparent electrode has micro-projections of a few nano-meters or more and partially has projections of tens or more nano-meters. In addition, the thinner the thickness of the injection layer becomes, the more likely foreign matter which enters after the film-formation of the injection layer passes through the layer and touches the electrode, and therefore, short defects easily occur.

In the structure of the traditional organic EL element, leak current is caused by the hole injection layer formed on the electrode and the partition wall, and luminescent efficiency is decreased. Hence, the purpose of the present invention is to provide an organic EL element and an image display unit in which leak current which decreases luminescent efficiency can be controlled and defects caused by foreign matter may be prevented.

Patent Document 1: JP-A-2001-93668
Patent Document 2: JP-A-2001-155858
Patent Document 3: Japanese Patent No. 2916098
Patent Document 4: Japanese Patent No. 2851185
Patent Document 5: JP-A-09-63771

SUMMARY OF THE INVENTION

In accordance with an aspect of the present invention, an organic electroluminescence element includes a first electrode on a substrate, a second electrode which faces the first electrode, a luminescent medium layer which is between the first electrode and the second electrode and includes an organic luminescent layer and a carrier injection layer between the first electrode and the organic luminescent layer, a first carrier injection layer formed on the first electrode, a partition wall formed so as to section the first electrode and cover a part of the first carrier injection layer, and a second carrier injection layer formed on the partition wall and the first carrier injection layer which is not covered by the partition wall.

101 is a support medium (a substrate).
102 is a pixel electrode (a first electrode).
103 is a partition wall.
104 is a first carrier injection layer.
105 is a second carrier injection layer.
106 is an organic luminescent layer.
107 is a counter electrode (a second electrode).
108 is a luminescent medium layer.
302 is a pixel electrode.
308 is a substrate having a TFT.
309 is a gate insulating film.
310 is a drain electrode.
311 is an active layer.
312 is a source layer.
313 is a scanning line.
314 is a gate electrode.
600 is a relief printing apparatus.
601 is a stage.
602 is a substrate to be printed.
603 is an ink tank.
604 is an ink chamber.
605 is an anilox roll.
606 is a doctor.
607 is a relief plate.
608 is a plate cylinder.
609 is an ink layer.

DETAILED DESCRIPTION OF THE INVENTION

Figure 1:
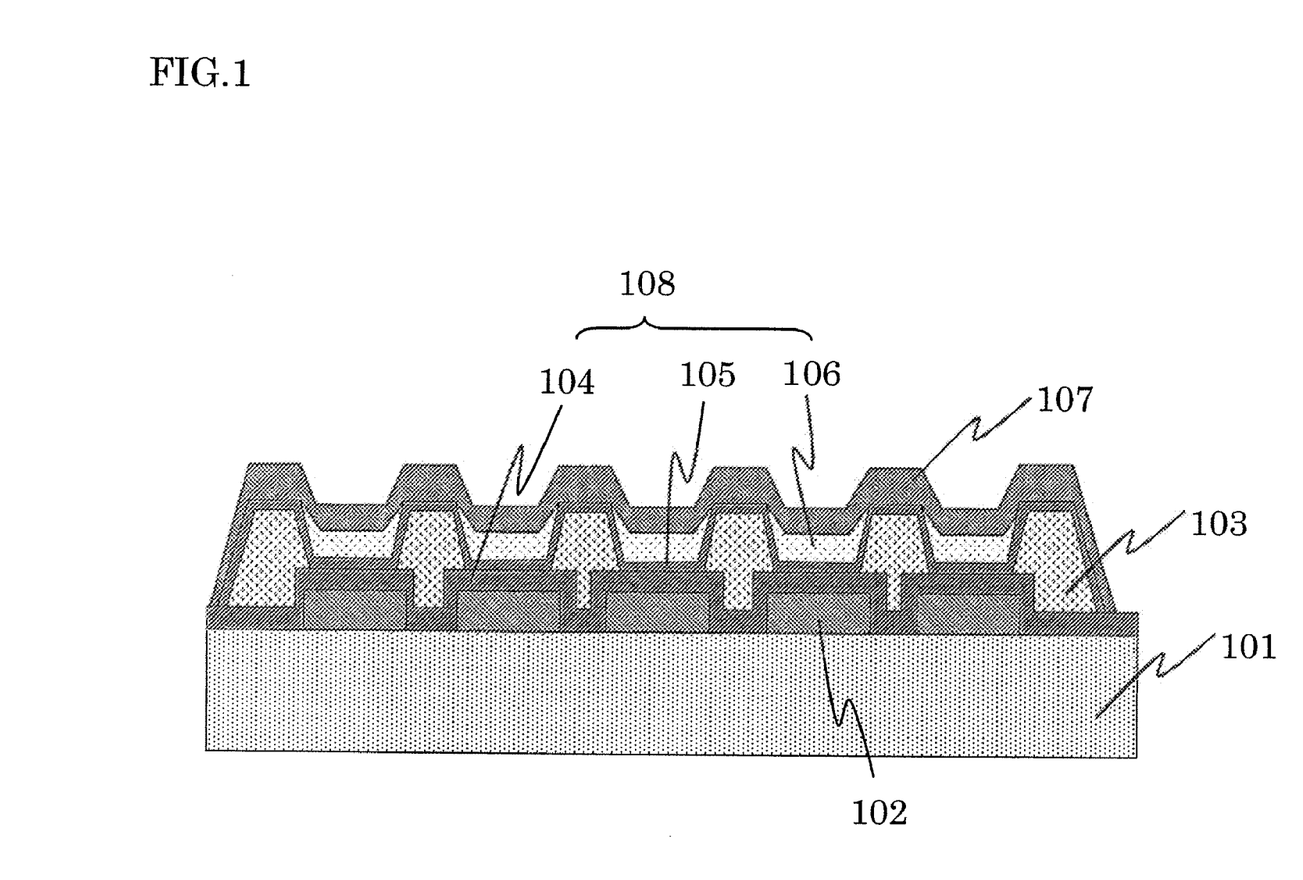
FIG. 1 is an explanatory cross sectional diagram of an organic EL element in accordance with one embodiment of the present invention.

FIG. 1 shows an explanatory cross sectional diagram of an organic EL element in accordance with one embodiment of the present invention. The organic EL element of the present invention has a first electrode 102 formed on a substrate 101 and a layer (a luminescent medium layer 108) sandwiched between the first electrode and a second electrode 107 which is formed so as to face the first electrode. The luminescent medium layer at least has an organic luminescent layer 106 which contributes to the emission of light, and a first carrier layer 104 and a second carrier layer 105 as a carrier injection layer which injects an electron or a hole. Moreover, as the luminescent medium layer 108, an electron injection layer or a hole blocking layer (an inter-layer) may be stacked between a cathode and the organic luminescent layer, and a hole injection layer and an electron blocking layer (an inter-layer) may be stacked Further, the organic EL element of the present invention has a partition wall 104 which sections the organic luminescent layer 106. In addition, an image display unit can be manufactured by arranging this kind of organic EL element as pixels (sub pixels). In addition, a full-color display panel can be manufactured, for example, by separately applying the luminescent layer 104 having each color (RGB) which constructs each pixel.

In the organic EL element of the preset invention, the above described first carrier injection layer 104 and second carrier injection layer 105 are formed between the first electrode 102 and the organic luminescent layer 106, and further, the partition wall covers at least one part of the first carrier injection layer 104. In other words, at least one part of the first carrier injection layer 104 is formed between the partition wall and the substrate. The second carrier injection layer 105 is formed so as to entirely cover the surfaces of the partition wall and the first electrode 102 on the substrate. By forming this kind of structure, the first carrier injection layer of the carrier injection layer formed between the organic luminescent layer 106 and the first electrode 104 is exposed only in a pixel part which is a luminescent area, and therefore, a thickness of the first carrier injection layer can be arbitrarily selected, because the first carrier injection layer does not contribute to a current leaking into the counter electrode.

Figure 2:
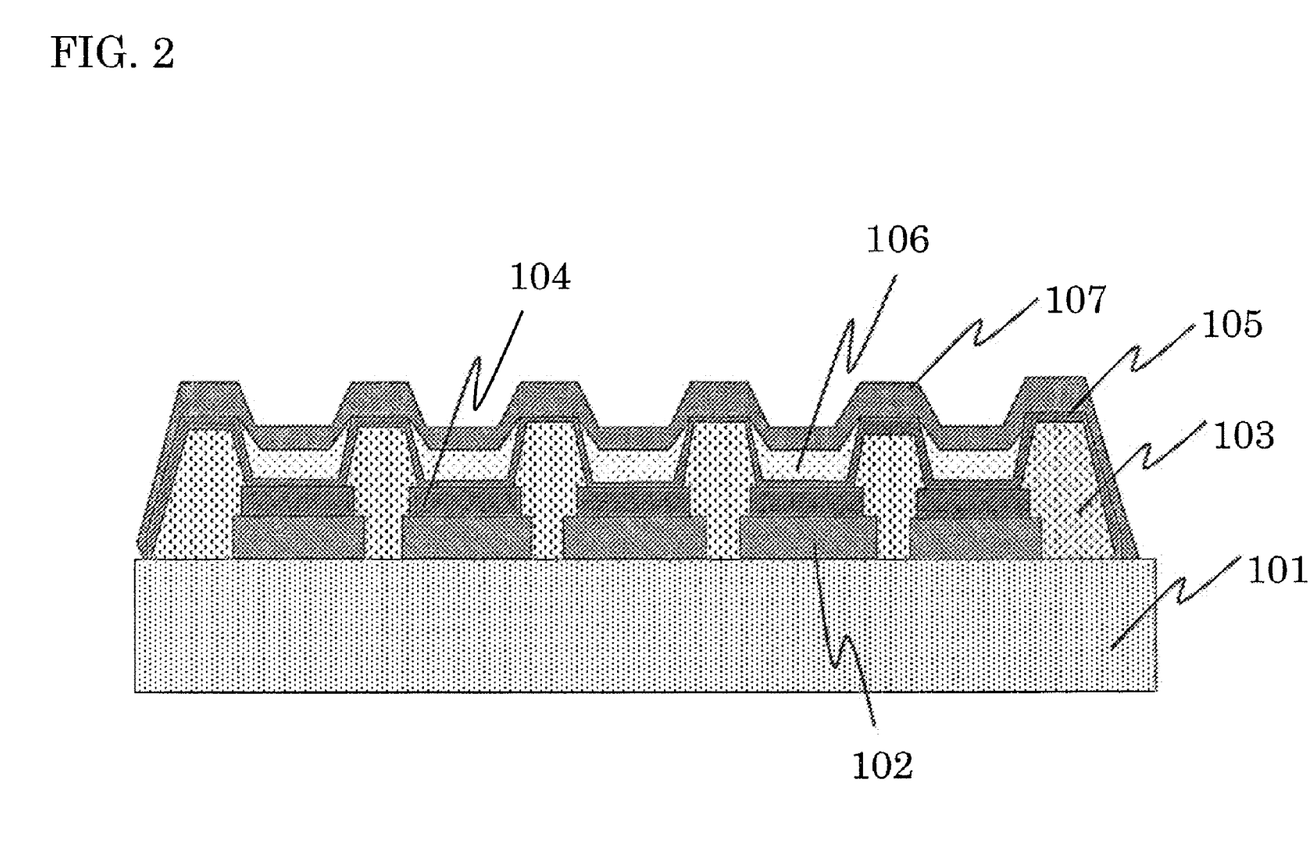
FIG. 2 is an explanatory cross-sectional diagram of an organic EL element in accordance with a second embodiment of the present invention.

The first carrier injection layer 104 may cover the entire surface of the substrate as shown in FIG. 1, or may be patterned and formed so as to only cover the top face of the first electrode as shown in FIG. 2. Defects such as a short which is caused by a convergence of an electrical field at an asperity of the edge part of the first carrier injection layer do not occur as long as the edge part of the first carrier injection layer is at least covered by the partition wall.

In the structure of the present invention, the surface of the first carrier injection layer 104 may be damaged at the time of patterning the partition wall, because the partition wall is formed after the formation of the first carrier injection layer. If a luminescent layer is formed on the damaged surface of the first carrier injection layer, the characteristics of the organic EL element may also be damaged. Consequently, the second carrier injection layer 105 is formed on the partition wall and the first carrier injection layer on the entire surface of the substrate. Thus, the surface of the carrier injection layer can be compensated. The second carrier injection layer 105 can be formed on the entire surface of the substrate, and therefore, patterning or an alignment is not required. Further, the second carrier injection layer may be formed as a thin film and can control a leak current as a film of a high resistivity formed on the partition wall, since the first carrier layer is formed on the first electrode. The total thickness of the first injection layer and the second injection layer, in other words, the thickness of the carrier injection layer in a pixel area, is preferably 20 nm or more. If the thickness is thinner than 20 nm, short defects easily occur.

The structure of the present invention is explained in detail below. An active matrix drive-type organic EL display unit which has a first electrode 102 as an anode and a second electrode 107 as a cathode is described as an example for describing the organic El display unit of the present invention. In this case, the first electrode is formed as a pixel electrode sectioned by a partition wall in accordance with each pixel, and the second electrode is a counter electrode formed on the entire surface of the element. In addition, a first carrier injection layer 104 and a second carrier injection layer 105 are hole injection layers having hole transporting properties. The present invention is not limited to this structure and includes a passive matrix drive type in which each electrode has a stripe shape which is perpendicular to each other. In addition, an organic EL element having an opposite structure where a first electrode is a cathode can also be manufactured. In this case, a first carrier injection layer and a second carrier injection layer are electron injection layers having electron transporting properties.

<A Substrate>

Figure 3:
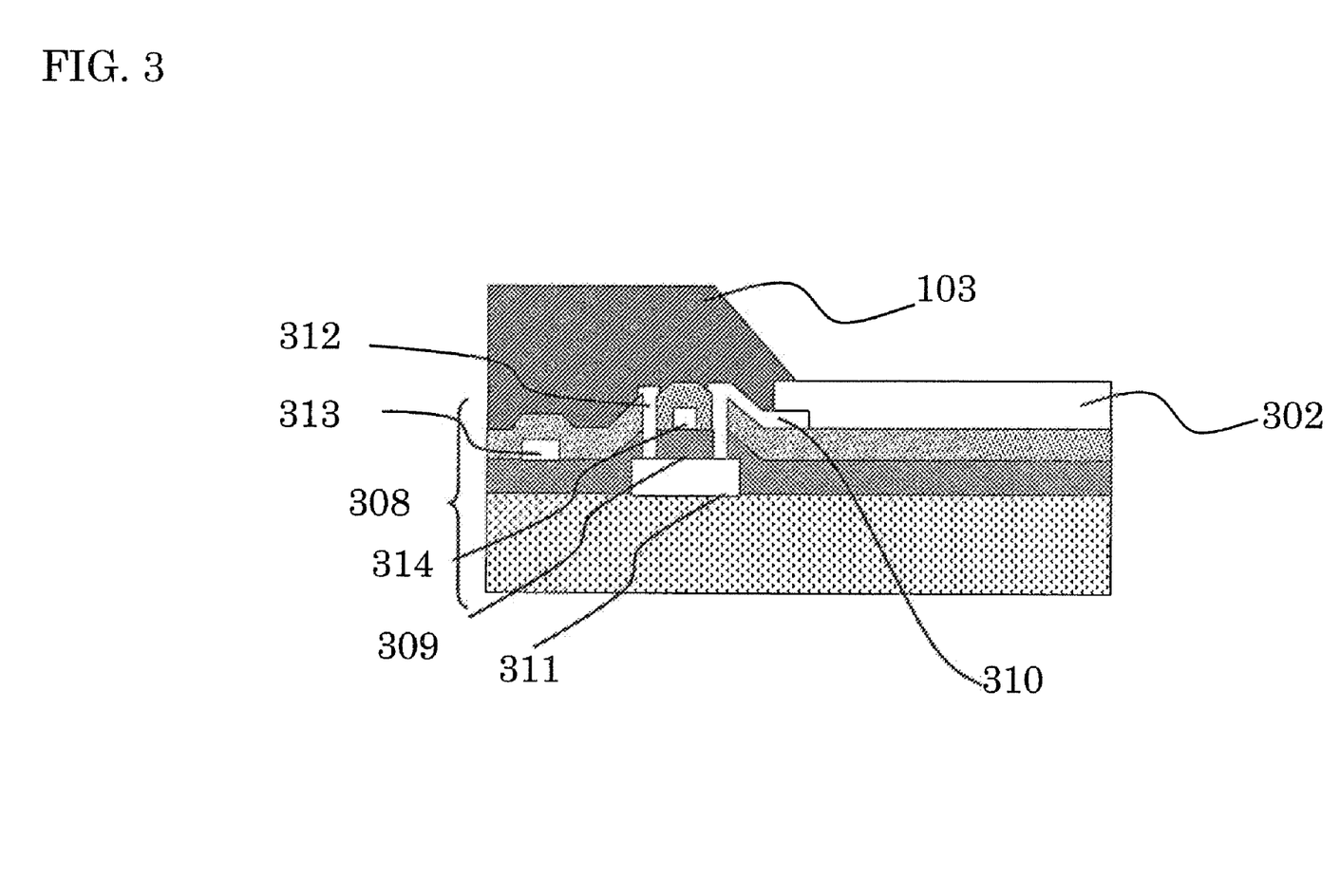
FIG. 3 is an explanatory cross-sectional diagram of a substrate having a TFT.

FIG. 3 shows an example of a TFT substrate having a partition wall of the present invention. A substrate 308 (a back plane) used for the active matrix drive type organic EL display unit of the present invention has a thin film transistor (a TFT) and a lower electrode (a pixel electrode) of the organic EL display unit. Further, the TFT and the lower electrode are electrically connected to each other.

The TFT and the active matrix drive type organic EL display unit formed thereon are supported by a support medium. Any material which provides the support medium with a mechanical strength, an insulating property and an excellent dimensional stability can be used as a material for the support medium. For example, glass or quartz, or a plastic film or sheet such as polypropylene, polyethersulfone, polycarbonate, cyclo olefin polymer, polyarylate, polyamide, polymethylmethacrylate, polyethylene terephthalate and polyethylene naphthalate can be used. In addition, a translucent base material in which a film of metallic oxide such as silicon oxide and aluminum oxide, metal fluoride such as aluminum fluoride and magnesium fluoride, metal nitrides such as silicon nitride and aluminum nitride, metal oxynitride such as silicon oxide nitride or a polymer resin film such as acryl resin, epoxy resin, silicone resin or polyester resin is stacked on the plastic film and sheet can be used. Furthermore, a translucent base material in which a plurality of the above mentioned films are stacked on the plastic film or sheet can also be used. In addition, a non-translucent base material in which a metal film such as aluminum, copper, nickel or stainless is stacked on the plastic film or sheet, or a metal foil, sheet or plate made of aluminum, stainless or the like can be used. A translucent property can be selected according to a side where light can be emitted. In order to prevent entry of moisture to the organic EL display unit, moisture exclusion or a hydrophobic treatment is preferably carried out by forming an inorganic film or applying a fluorine resin on the support medium of the above mentioned material. In particular, in order to prevent entry of moisture to the luminescent medium layer, a moisture content rate and a gas transmission coefficient of the support medium are preferably made small.

A heretofore known thin film transistor can be used as a thin film transistor arranged on the support medium. In particular, a thin film transistor composed chiefly of an active layer having a source/drain area and a channel area, a gate insulating film and a gate electrode can be exemplified. The structure of the thin film transistor is not particularly limited, for example, a staggered type, an inversely staggered type, a top gate type and a coplanar type can be used.

The active layer 311 is not particularly limited, and for example, an inorganic semiconductive material such as amorphous silicon, multicrystalline silicon, microcrystal silicon and cadmium selenate or an organic semiconductive material such as thiophene oligomer and poly (p-phenylene vinylene) can be used for the active layer. The active layer 311 can be formed by each of the following methods: 1. A method of doping ion after stacking amorphous silicon by plasma CVD. 2. A method having the following process: Amorphous silicon is formed by LPCVD (LOW PRESSURE CHEMICAL VAPOR DEPOSITION) using a $SiH_4$ gas. Next, by crystallizing amorphous silicon by a solid phase growth method, polysilicon is obtained. Thereafter, ion doping is performed by an ion doping method. 3. A low temperature process having the following process: Amorphous silicon is formed by LPCVD using a $Si_2H_6$ gas or by PECVD (PLASMA ENHANCED CHEMICAL VAPOR DEPOSITION) using a $SiH_4$ gas. Then, the amorphous silicon is crystallized by annealing with a laser such as an excimer laser, and, a polysilicon is obtained. Thereafter, ion doping is performed by an ion doping method. 4. A high temperature process having the following process: Polysilicon is stacked by low pressure CVD or LPCVD. A gate insulating film is formed by thermally oxidizing the polysilicon at 1,000 degrees Celsius or more. Thereupon, a gate electrode of n+ polysilicon is formed. Next, ion doping is carried out by an ion doping method.

A material generally used for a gate insulating film, for example, $SiO_2$ formed by a PECVD method, a LPCVD method or the like, or $SiO_2$ obtained by thermally oxidizing a polysilicon film can be used for the gate insulating film 309.

A material generally used for a gate electrode, for example, metal such as aluminum and copper, metal with a high melting point such as titanium, tantalum and tungsten, polysilicon, silicide of metal with a high melting point and polycide can be used for the gate electrode 314.

The thin film transistor may have a single-gate structure, a double-gate structure or a multi-gate structure having three or more gate electrodes. In addition, the thin film transistor may also have a LDD structure or an off-set structure. Further, two or more thin film transistors may be arranged within one pixel.

In the display unit of the present invention, the thin film transistor is required to be connected so as to operate as a switching element of the organic EL display unit. A drain electrode 310 of the thin film transistor and the pixel electrode of the display unit are electrically connected to each other.

<A Pixel Electrode>

The pixel electrode 102 is formed on the substrate and patterned as necessary. The pixel electrode is sectioned by a partition wall so as to correspond to each pixel in the present invention. For a material of the pixel electrode, a metal compound oxide such as ITO (indium tin compound oxide), indium zinc compound oxide and zinc aluminum compound oxide, a metal material such as gold and platinum, and a monolayer or a layer stack of a particle dispersion membrane which is made by dispersing particles of the metal compound oxide or the metal material into epoxy resin, acrylic resin or the like can be used. When the pixel electrode is an anode, a material having a high work function such as ITO is preferably selected. When an organic EL element has a bottom emission structure in which light is emitted from the bottom the organic EL element, it is required to select a material having a translucent property. In order to lower a wiring resistivity of the pixel electrode, a metal material such as copper and aluminum can be arranged as an auxiliary electrode, as necessary. As a method of forming the pixel electrode, a dry film formation method such as a resistance heating deposition method, an electron beam deposition method, a reactive deposition method, an ion plating method and sputtering, a wet film formation method such as a gravure printing method and a screen printing method can be used depending on the material of the pixel electrode. As a method of patterning the pixel electrode, an existing patterning method such as a mask evaporation method, a photolithographic method, a wet etching method and a dry etching method can be used depending on the material and the film formation method. When a product having a TFT is used as a substrate, the product having a TFT is formed so that the pixel electrode is electrically connected to the TFT.

<A First Carrier Injection Layer>

The first carrier injection layer 104 of the present invention is patterned so as to cover the electrode or formed on the entire surface of the substrate. As a hole transport material for the first carrier injection layer 104, a polythiophene derivative, a polyvinyl carbazole (PVK) derivative and poly(3,4-ethylenedioxythiophene) (PEDOT) can be exemplified. The above mentioned material is dissolved or dispersed in a solvent and the first carrier injection layer can be formed by various coating methods in which a spin-coater or the like is used, or by a relief printing method.

Moreover, when an inorganic material is used as a hole transport material, an inorganic compound including one or more kinds of transition metal oxide such as $Cu_2O$, $Cr_2O_3$, $Mn_2O_3$, $FeOx(x\sim0.1)$, $NiO$, $CoO$, $Pr_2O_3$, $Ag_2O$, $MoO_2$, $Bi_2O_3$, $ZnO$, $TiO_2$, $SnO_2$, $ThO_2$, $V_2O_5$, $Nb_2O_5$, $Ta_2O_5$, $MoO_3$, $WO_3$ and $MnO_2$, and nitride and sulfide thereof can be used. However, the material for the carrier injection layer is not limited to the above. Since there are a variety of inorganic materials having excellent thermal resistance and excellent electrochemical stability, an inorganic material is favorably used. A single layer, a laminate structure of a multilayer or a mixed layer of the above materials can be formed as the first carrier injection layer. The thickness the first carrier injection layer is preferably 5 nm or more, and more preferably, approximately 15 nm or more. Luminescent efficiency depends on the total thickness of the first carrier injection layer and the second carrier injection layer, and the total thickness is preferably approximately 20-150 nm. The thickness of the first carrier injection layer is the total thickness with excellent luminescent efficiency minus the thickness of approximately 10 nm of the second carrier injection layer which can prevent a decrease in luminescent efficiency caused by leak current. As a method for forming the hole injection layer, a dry film formation method such as a resistance heating deposition method, an electron beam deposition method, a reactive deposition method, an ion plating method and sputtering, a wet film formation method such as a spin-coating method and a sol-gel method can be used depending on the material. However, a usable method is not limited to these methods in the present invention and general film-formation methods can be used.

<A Partition Wall>

The partition wall 103 of the present invention is formed so as to section a luminescent area which corresponds to a pixel and is preferably formed so as to cover the edge part of the pixel electrode 102. (Refer to FIG. 2) In a general active matrix drive type display unit, the pixel electrode 102 is formed in each pixel (sub pixels) and each pixel possesses as large an area as possible. Hence, the most favorable shape of the partition wall which covers the edge part of the pixel electrode is a lattice shape which sections each pixel electrode in a shortest distance.

A dry etching method carried out after forming an inorganic film uniformly on a base body and performing masking with a resist or a method in which a photosensitive resin is stacked on the base body, and is patterned to have a predetermined shape by a photolithographic method can be used as a method for forming the partition wall. If necessary, the partition wall may be irradiated with plasma or UV or a water repellent agent may be added after forming the partition wall so that the partition wall has a water-repellent property to an ink. The height of the partition wall is preferably 0.1-10 μm, and more preferably, approximately 0.5-2 μm. When the height is too high, the partition wall encumbers a formation of a counter electrode and sealing. When the height is too low, the partition wall cannot entirely cover the edge parts of the pixel electrode, or a color may be mixed with another color in an adjacent pixel at the time of forming the luminescent medium layer.

<A Second Carrier Injection Layer>

The second carrier injection layer 105 is formed by the same method as the first carrier injection layer 104 along with the process described above after the partition wall is formed. Just before the second carrier injection layer is formed, surface processing is preferably carried out on the film of the first carrier injection layer in order to control a carrier trap on an interfacial surface or to improve adhesion between the second carrier injection layer and the first carrier injection layer. For surface processing, a plasma treatment with a gas such as oxygen, argon and nitrogen, an UV ozone treatment or the like can be employed. In the case of forming the second carrier injection layer by sputtering, surface processing can be performed by reverse sputtering where a cathode and an anode are in the opposite sides of the sputtering process If reverse sputtering is employed, the process of manufacturing the display unit can be simplified, because simply changing an application direction of a voltage of a sputtering apparatus makes it possible that surface processing with a plasma treatment and the film-formation of the second carrier injection layer are continually carried out. The material which can be used for the first carrier injection layer may be used for a material for the second carrier injection layer. In particular, the same material as the first carrier injection layer is preferably used. If the same material is used, the work functions of the materials are the same, and thus, injection of a carrier is not hindered. The thickness of the second carrier injection layer is preferably 5-15 nm, which can control a decline in efficiency caused by leak current. When the thickness is thinner than 5 nm, the surface of the second carrier injection layer on which a luminescent layer is formed does not become entirely uniform and an effect obtained by uniformity of the surface may decrease. When the thickness is more than 15 nm, leak current from the partition wall becomes larger.

After the second carrier injection layer is formed, an inter-layer may be formed. For a material of the inter-layer, polyvinyl carbazole, a polyvinylcarbazole derivative or polymers which have aromatic amine such as a polyarylene derivative, an aryl amine derivative and a triphenyl diamine derivative having aromatic amine in a main chain or a side chain can be used.

The material for the second carrier injection layer is dissolved or dispersed in a solvent, and the second carrier injection layer can be formed by various coating methods in which a spin-coater or the like is used, or by a relief printing method.

<An Organic Luminescent Layer>

After the inter-layer is formed, an organic luminescent layer 106 is formed. The organic luminescent layer emits light by applying a voltage. When display light emitted from the organic luminescent layer 106 has a single color, the organic luminescent layer is formed so as to cover the inter-layer. In order to obtain display light having multiple colors, the organic luminescent layer is favorably used by patterning as necessary.

For an organic luminescence material for the organic luminescent layer 106, a material made by scattering a luminous pigment in high molecular can be used. Coumarin system, perylene system, pyran system, anthrone system, porufiren system, quinacridon system, N,N'-dialkyl permutation quinacridon system, naphthalimido system, N,N'-diaryl permutation pyrrolo pyrrole series and iridium complex system are examples of the luminous pigment. Polystyrene, polymethyl methacrylate and polyvinyl carbazole are examples of the high molecular. Alternatively, a high molecular material such as poly arylene system, polyarylenevinylene system or poly fluorene system can be used for the organic luminescence material. However, a usable material is not limited to these.

An organic luminous ink can be obtained by dissolving or stably dispersing the organic luminescence material into a solvent. As a solvent in which the organic luminescence material is dissolved or dispersed, a single solvent or a mixed solvent of toluene, xylene, acetone, anisole, methyl ethyl ketone, methyl isobutyl ketone, cyclohexanone or the like can be used. Among the above, an aromatic organic solvent such as toluene, xylene and anisole is preferably used from an aspect of solubility of the organic luminescence material. In addition, a surface active agent, an antioxidant, a viscosity modifier, an ultraviolet absorber may be added to the organic luminous ink as necessary.

In addition to the above mentioned high molecular material, a low molecular luminescence material can be used. For example, 9,10-diaryl anthracenes derivative, pyrene, coronene, perylene, rubrene, 1,1,4,4-tetraphenylbutadiene, tris(8-quinolate) aluminum complex tris(4-methyl-8-quinolate) aluminum complex, bis(8-quinolonate)zinc complex, tris(4-methyl-5-trifluoromethyl-8-quinolonate) aluminum complex, tris(4-methyl-5-cyano-8-quinolonate) aluminum complex, bis(2-methyl-5-trifluoromethyl-8-quinolonate) [4,4-tetra phenylbutadiene, tris(8-hydroxyquinolonate) aluminum complex, tris(4-methyl-8-hydroxyquinolonate) aluminum complex, bis(2-methyl-5-trifluoromethyl-8-quinolinolate) [4-(4-cyanophenyl)phenolate]aluminum complex, bis(2-methyl-5-cyano-8-quinolinolate)[4-(4-cyanophenyl)phenolate] aluminum complex, tris(8-quinolinolate) scandium complex, bis[8-(para-tosyl) aminoquinoline]zinc complex and cadmium complex, 1,2,3,4-tetraphenylcyclopentadiene and poly-2,5-diheptyloxi-paraphenylenevinylene can be used.

As a method for forming the organic luminescent layer 106, heretofore known film-formation methods can be used, for example, a dry film formation method such as a resistance heating deposition method, an electron beam deposition method, a reactive deposition method, an ion plating method and sputtering, a wet film formation method such as an ink-jet printing method, a relief printing method, a gravure printing method and a screen printing method can be used depending on the material for the organic luminescent layer. However, a usable method is not limited to these methods in the present invention.

<A Method for Forming a Luminescent Medium Layer>

When a luminescent medium layer is formed by a coating method, the following relief printing method can be used. In particular, in the case of separately coating each color of the luminescent layer using an organic luminous ink made by dissolving or stably dispersing an organic luminescence material in a solvent, a relief printing method by which the luminescent layer can be patterned by transferring inks into areas between the partition walls can be preferably used.

Figure 4:
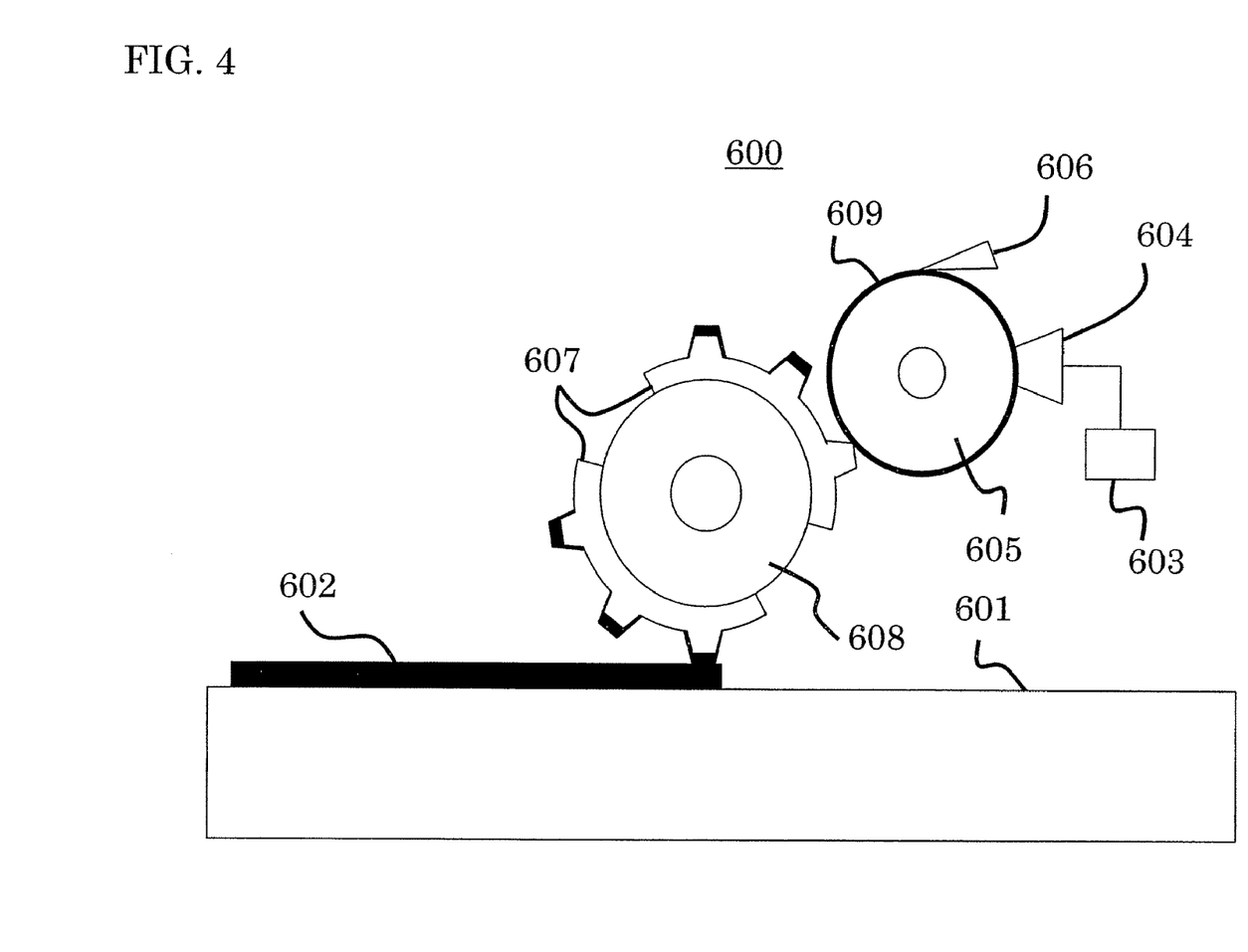
FIG. 4 is a schematic diagram of a relief printing apparatus.

FIG. 4 shows a schematic view of a relief printing apparatus 600 for printing and patterning the organic luminous ink made of the organic luminescence material on a substrate to be printed 602 on which a pixel electrode, a hole injection layer and an inter-layer are formed. The relief printing apparatus has an ink tank 603, an ink chamber 604, an anilox roll 605 and a plate cylinder 608 on which a plate 607 having a relief plate is equipped. An organic luminous ink diluted in a solvent is kept in the ink tank 603 and transferred to the ink chamber 604 from the ink tank. The anilox roll 605 touches an ink feed section of the ink chamber 604, and the anilox roll is rotatably supported.

Along with the rotation of the anilox roll 605, an ink layer 609 of an organic luminous ink is formed with a uniform thickness on the surface of the anilox roll. The ink of this ink layer is transferred to projection parts of the plate 607 arranged on the plate cylinder 608 which is rotationally driven in proximity to the anilox roll. The substrate to be printed 602 is arranged on a stage 601. The ink on the projection parts of the plate 607 is printed on the substrate to be printed 602. Then, the organic luminescent layer can be formed on the substrate to be printed through a dry process as necessary.

In the case where another luminescent medium layer is coated using an ink, the above mentioned formation method can be used.

<An Electron Injection Layer>

After the organic luminescent layer 106 is formed, a hole blocking layer, an electron injection layer or the like can be formed. These function layers can arbitrarily be selected according to a size of an organic EL display panel or the like. For a material of the hole blocking layer or the electron injection layer, a material generally used as an electron transport material, for example, a low-molecular material such as triazole series, oxazole series, oxadiazole series, silole series and boron series, or salt or oxide of alkali metal or alkaline earth metal such as lithium fluoride and lithium oxide can be used. The hole injection layer and the electron injection layer can be formed by a vacuum deposition method using the above material. An electron injection coating liquid can be prepared by dissolving the electron transport material in a high-molecular such as polystyrene, polymethylmethacrylate and polyvinylcarbazole, and dissolving or dispersing the above mentioned dissolved material or the electron transport material in a single solvent or a mixed solvent such as toluene, xylene, acetone, methyl ethyl ketone, methyl isobutyl ketone, cyclohexanone, methanol, ethanol, isopropyl alcohol, ethyl acetate, butyl acetate and water.

<A Counter Electrode>

Next, a counter electrode 107 is formed. When the counter electrode is a cathode, a material having a low work function and high efficiency of injecting an electron into the luminescent layer 106 is used. Particularly, a metal simple substance such as Mg, Al and Yb can be used. Alternatively, a layer stack having films of Al and Cu which have a high stability and electric conductivity can be used while about 1 nm of a film made of a compound of Li, lithium oxide, LiF or the like is in an interfacial surface of the luminescent medium layer. Alternatively, in order to have a balance of electron injecting efficiency and stability, an alloy of one or more kinds of metals such as Li, Mg, Ca, Sr, La, Ce, Er, Eu, Sc, Y and Yb which have a low work function and metal elements such as Ag, Al and Cu which are stable can be used. In particular, an alloy such as MgAg, AlLi and CuLi can be used.

As a method for forming the counter electrode 107, a resistance heating deposition method, an electron beam deposition method, a reactive deposition method, an ion plating method or sputtering can be used.

<A Sealing Body>

The organic EL display apparatus having a luminescence material sandwiched between the electrodes can emit light by applying a voltage. However, an organic luminescence material can be easily deteriorated by moisture or oxygen in air. Hence, a sealing body is generally arranged in order to seal the organic EL element from the outside. The sealing body can be formed, for example, by arranging a resin layer on a sealing material.

The sealing material is required to be a base material having a low permeability of moisture or oxygen. In addition, ceramics such as alumina, silicon nitride and boron nitride, glass such as non-alkali glass and alkali glass, quartz, and a moisture resistance film can be exemplified as the sealing material. As a moisture resistance film, a film made by forming SiOx on both sides of a plastic base material by CVD, a polymeric film on which a film of a low permeability and a film of water absorbability or a water absorbent are coated can be exemplified. In addition, moisture vapor permeability of the moisture resistance film is preferably $10^{-6}$ g/m$^2$/day or less.

The following materials can be used as a material for a resin layer. A photo-hardening adhesive property resin, a heat hardening adhesive property resin and two fluid hardening adhesive property resin including an epoxy type resin, acrylic resin, silicone resin or the like, acrylic resin such as ethylene ethylacrylate (EEA) polymer, vinyl resin such as ethylene vinyl acetate (EVA), a thermoplastic resin such as polyamide, synthetic rubber, and thermoplastic adhesive property resin such as acid denatured substances of polyethylen or polypropylene can be used. As a method for forming the resin layer on the sealing material, a solvent solution method, an extrusion laminate method, a fusion/hot melt method, a calender method, a discharge jet application method, a screen printing method, a vacuum laminate method and a heated roll laminate method can be exemplified. A material having hygroscopicity or a property of absorbing oxygen can be included in a resin layer if necessary. A thickness of the resin layer formed on the sealing material is arbitrarily selected depending on the size and the shape of an organic EL display apparatus sealed from the outside. However, the thickness is preferably about 5 μm~500 μm. Further, here a resin layer is formed on a sealing material as a sealing body. However, a sealing body can be directly formed on the organic EL display apparatus.

Lastly, the organic EL display apparatus and the sealing body are adhered in a sealing room. When the sealing body has a two-layer structure of a sealing material and a resin layer formed of a thermoplastic resin, pressure bonding only is preferably performed by a heated roller. When the resin layer is formed of a heat hardening adhesive property resin, additionally, heat hardening is preferably performed at a hardening temperature after pressure bonding is performed by a heated roller. When, the resin layer is formed of a photo-hardening adhesive property resin, after pressure bonding is performed by a heated roller, hardening can further be carried out by irradiation with radiation.

According to the present invention, in an organic EL display panel, after a first hole injection layer is formed so as to cover projections or foreign matter on an electrode, a partition wall is formed so as to section pixels. Thereafter, a thin film of a second hole injection layer is formed such that a decrease in an efficiency is not caused by leak current. Therefore, a display panel having sustainable efficiency without defects caused by foreign matter can be obtained in the present invention.

EXAMPLES

Example 1

Examples of the present invention are explained below.

An active matrix substrate having a thin film transistor which operates as a switching element arranged on a support medium and having a pixel electrode formed thereon was used as a substrate. The size of the substrate was 200 mm×200 mm and a display with 320×240 pixels and a size of 5 inches was arranged in the center of the substrate. A connection electrode and a contact part were arranged on the edge part of the substrate.

The substrate was arranged in a sputtering film-formation apparatus where a molybdenum target was installed. A first carrier injection layer was patterned and formed on a display area so as not to cover the connection electrode and the contact part. A sputtering condition was that pressure was 1 Pa, electricity was 1 kW and a flow ratio of oxygen to argon gas was 30%. The thickness of the first carrier injection layer was 50 nm. Thereafter, a partition wall was formed so as to cover the edge part of a pixel electrode and section pixels formed on the substrate. The partition wall with a thickness of 2 μm was formed on the entire surface of the substrate by spin coating a positive resist ZWD6216-6 manufactured by ZEON CORPORATION. Thereafter, the partition wall was formed to have a width of 40 μm by a photolithographic method. In this way, a pixel area was sectioned so that the number of sub pixels was 960×240 dot and the pitch was 0.12 mm×0.36 mm.

A second carrier injection layer with a thickness of 10 nm was formed on the pixel electrode under the same condition as the first carrier injection layer.

Thereafter, after the substrate was set on a relief printing apparatus, an interlayer was printed right above the pixel electrode so as to correspond to the line pattern of the pixel electrode between partition walls by a relief printing method using an ink where polyvinyl carbazole derivative which was a material for an interlayer was dissolved in toluene so that a concentration of the polyvinyl carbazole derivative became 0.5%. At this time, an anilox roll of 300 lines/inch and a photosensitive resin plate were used. The film thickness of the interlayer after printing and drying was 10 nm.

Next, after the substrate was set on the relief printing apparatus, an organic luminescent layer was printed right above the pixel electrode so as to correspond to the line pattern of the pixel electrode between partition walls by a relief printing method using an organic luminous ink where polyphenylene vinylene derivative which was an organic luminescence material was dissolved in toluene so that a concentration of the polyphenylene vinylene derivative became 1%. At this time, an anilox roll of 150 lines/inch and a photosensitive resin plate which corresponded to pitches of pixels were used. The film thickness of the organic luminescent layer after printing and drying was 80 nm.

This process of forming the organic luminescent layer was repeated three times and the organic luminescent layers corresponding to luminous colors of RGB were respectively formed in pixels.

Thereafter, a film of calcium with a thickness of 10 nm was formed by a vacuum deposition method as an electron injection layer. Then, a film of aluminum with a thickness of 150 nm was formed as a counter electrode.

Thereafter, a glass plate was arranged so as to entirely cover the luminescent area as a sealing material and sealing was carried out by thermally hardening an adhesive for 1 hour at approximately 90 degrees Celsius. The active matrix drive type organic EL display unit obtained in this example was driven, and could be driven excellently.

Example 2

A target having a mixture ratio of 3:1 of molybdenum and titanium was used as a target used for forming a first carrier injection layer by sputtering. A second carrier injection layer was formed by using the same target. The first carrier injection layer with a thickness of 100 nm and the second carrier injection layer with a thickness of 20 nm were respectively formed using the same substrate as in example 1. At this time, film-formation conditions for the injection layers included the same sputtering condition as in example 1. The film-formation conditions for the other films were all the same as in example 1.

Thereafter, a glass plate was arranged so as to entirely cover the luminescent area as a sealing material and sealing was carried out by thermally hardening an adhesive for 1 hour at approximately 90 degrees Celsius. The active matrix-drive type organic EL display unit obtained in this way was driven, and could be driven excellently.

Example 3

A target having a mixture ratio of 3:1 of molybdenum and nickel was used as a target used for forming a first carrier injection layer by sputtering. A second carrier injection layer was formed by using the same target. The first carrier injection layer with a thickness of 80 nm and the second carrier injection layer with a thickness of 100 nm were respectively formed using the same substrate as in example 1. At this time, film-formation conditions for the injection layers included the same sputtering condition as in example 1. The film-formation conditions for the other films were all the same as in example 1.

Thereafter, a glass plate was arranged so as to entirely cover the luminescent area as a sealing material and sealing was carried out by thermally hardening an adhesive for 1 hour at approximately 90 degrees Celsius. The active matrix-drive type organic EL display unit obtained in this way was driven, and could be driven excellently.

Comparative Example

Firstly, a partition wall was formed using the same substrate as in example 1 before a carrier injection layer was formed. Thereafter, the carrier injection layer with a thickness of 60 nm was formed using the same target under the same sputtering condition as in example 1. The film-formation methods for the other films were all the same as in the examples.

Thereafter, a glass plate was arranged so as to entirely cover the luminescent area as a sealing material and sealing was carried out by thermally hardening an adhesive for 1 hour at approximately 90 degrees Celsius. The active matrix-drive type organic EL display unit obtained in this way was driven. Then, the partition wall emitted light by leak current and luminous efficiency was significantly decreased.

What is claimed is:

1. An organic electroluminescence element comprising;
    a first electrode on a substrate;
    a second electrode facing the first electrode;
    a luminescent medium layer sandwiched between the first electrode and the second electrode, the luminescent medium layer including an organic luminescent layer and a carrier injection layer formed between the first electrode and the organic luminescent layer, the carrier injection layer including a first carrier injection layer being formed on the first electrode and a second carrier injection layer; and
    a partition wall formed so as to section the first electrode and cover a part of the first carrier injection layer, the second carrier injection layer being formed on the partition wall and the first carrier injection layer which is not covered by the partition wall.

2. The organic electroluminescence element according to claim 1, wherein a material for the first carrier injection layer and the second carrier injection layer is the same material.

3. The organic electroluminescence element according to claim 1, wherein the first carrier injection layer and the second carrier injection layer are formed from an inorganic material.

4. The organic electroluminescence element according to claim 1, wherein a total thickness of the first carrier injection layer and the second carrier injection layer on the first electrode is 20 nm or more.

5. An organic electroluminescence display panel comprising the organic electroluminescence element according to claim 1.

6. A method for manufacturing an organic electroluminescence display panel, the organic electroluminescence display panel comprising:
    a first electrode on a substrate;
    a second electrode facing the first electrode;
    a partition wall sectioning the first electrode; and
    a luminescent medium layer between the first electrode and the second electrode, the luminescent medium layer including an organic luminescent layer and a carrier injection layer formed between the first electrode and the organic luminescent layer, the carrier injection layer including a first carrier injection layer and a second carrier injection layer; and
    the method comprising:
    patterning the first electrode;
    forming the first carrier injection layer on the first electrode;
    forming a partition wall so as to cover an edge part of the first electrode and a part of the first carrier injection layer; and,
    forming the second carrier injection layer on the first carrier injection layer and the partition wall.

7. The method for manufacturing an organic electroluminescence display panel according to claim 6, wherein surface processing is performed on the first carrier injection layer after forming the first carrier injection layer and before forming the second carrier injection layer.

8. The method for manufacturing an organic electroluminescence display panel according to claim 6, wherein surface processing is a plasma treatment.

9. The method for manufacturing an organic electroluminescence display panel according to claim 6, wherein a reverse sputtering process is carried out after forming the first carrier injection layer and before forming the second carrier injection layer.

10. The method for manufacturing an organic electroluminescence element according to claim 6, wherein the first carrier injection layer and the second carrier injection layer are formed from an inorganic material by a dry film-formation method.

11. The method for manufacturing an organic electroluminescence element according to claim 6, wherein the organic luminescent layer is formed by coating an organic luminous ink in which an organic luminescence material is dissolved or dispersed in a solvent.

* * * * *